United States Patent [19]

Lenz

[11] Patent Number: 4,953,070
[45] Date of Patent: Aug. 28, 1990

[54] METHOD FOR TRANSVERSE-CURRENT-FREE OPERATION OF A PUSH-PULL CIRCUIT, AND APPARATUS FOR PERFORMING THE METHOD

[75] Inventor: Michael Lenz, Zorneding, Fed. Rep. of Germany

[73] Assignee: Siemens Aktiengesellschaft, Munich, Fed. Rep. of Germany

[21] Appl. No.: 256,745

[22] Filed: Oct. 12, 1988

[30] Foreign Application Priority Data

Oct. 12, 1987 [DE] Fed. Rep. of Germany ....... 3734500

[51] Int. Cl.$^5$ ............................................ H02H 7/122
[52] U.S. Cl. ........................................ 363/58; 361/18; 361/90; 361/111
[58] Field of Search ................. 363/50, 56, 57, 58; 361/18, 86, 87, 88, 93, 90, 91, 111; 307/252 P, 254, 255, 257

[56] References Cited

U.S. PATENT DOCUMENTS

| 3,490,028 | 1/1970 | Modiano | 363/17 |
| 4,095,128 | 6/1978 | Tanigaki | 363/56 X |
| 4,126,819 | 11/1978 | Stobbe et al. | 363/56 X |
| 4,158,224 | 6/1979 | Kreyer et al. | 363/56 |
| 4,456,949 | 6/1984 | Incledon | 363/56 X |
| 4,553,198 | 11/1985 | Chan et al. | 363/56 |
| 4,633,381 | 12/1986 | Upadhyay | 363/56 |
| 4,739,465 | 4/1988 | Asano et al. | 363/56 |

OTHER PUBLICATIONS

Patent Abstracts of Japan, vol. 5, No. 179 (E-82) [851], Nov. 17, 1981, & JP-A-56103971 (Tokyo Shibaura Denki K.K.), Aug. 19, 1981.
Patent Abstract of Japan, vol. 5, No. 86 (E-60) [758], Jun. 5, 1981; & JP-A-5634227 (Pioneer K.K.), Apr. 6, 1981.
Silicon General Linear Integrated Circuits, "2 Amp Quad Motor Driver", Jun., 1985.
Integrated Power Semiconductors Ltd., Book No. 21, 1986.

Primary Examiner—Mark O. Budd
Assistant Examiner—Emanuel T. Voeltz
Attorney, Agent, or Firm—Herbert L. Lerner; Laurence A. Greenberg

[57] ABSTRACT

A method for transverse-current-free operation of a push-pull circuit configuration having two output transistor arrays of complementary types with output circuits interconnected in series, and a trigger circuit triggering the output transistor arrays with two push-pull signals being derived from one input signal and having mutually associated edges consecutively following one another with temporal separation, and detecting output currents of the output transistor arrays. The method includes releasing the particular triggering push-pull signal for an output transistor array without delay whenever the output current of the complementary output transistor arrays drops below a predetermined positive minimum value. An apparatus for performing the method includes comparators associated with the output transistor arrays for detecting the predetermined minimum output currents. The comparators each have an output cross-coupled directly to the first input of a respective logical linkage element. The second input of one of the logical linkage elements receives the input signal and the second input of the other of the logical linkage elements receives an inverted input signal.

4 Claims, 2 Drawing Sheets

METHOD FOR TRANSVERSE-CURRENT-FREE OPERATION OF A PUSH-PULL CIRCUIT, AND APPARATUS FOR PERFORMING THE METHOD

The invention relates to a method and apparatus for operation of a push-pull circuit free of transverse-current, cross-current or a quadrature-axis component of current, the circuit configuration having two output transistor arrays of complementary types with output circuits interconnected in series, and a trigger circuit triggering the output transistor arrays with two push-pull signals derived from one input signal, the push-pull signals having mutually associated edges consecutively following one another temporally for detecting output currents of the output transistor arrays.

Push-pull circuit configurations are used primarily because they provide a high power output at good efficiency. In such circuits, complementary output transistors having output circuits connected in series are triggered by push-pull signals, which are derived from a common input signal. Either one transistor is conductive and the complementary type blocks, or vice-versa. Problems arise especially at the transition from one operating state to the other, especially during switching operation, because the switching times of the transistors depend not only on the type but primarily on saturation effects. For physical reasons, transistors fundamentally switch on faster than than they switch off. This situation is illustrated in FIG. 1 of the drawing.

Upon a simultaneous reversal of the two complementary transistors, one of the transistors becomes fully conductive before the other transistor fully blocks, because of the effect explained in conjunction with FIG. 1. In that case, both output transistors are conductive, and the currents flowing through them rise to a value that is limited only by the current gain of the output transistors. This transverse-current, cross-current or quadrature-axis component of current or cross-line current, flowing between the connection poles of the supply voltage source, produces very high power losses, or even damages the output transistors. From the moment that the base of the transistor entering the blocking state is evacuated or emptied, the transverse current drops, and the output voltage can assume the specified value.

Solutions to the problem of transverse currents which have been proposed heretofore have been based on the concept of separating the trigger signals for the complementary output transistors by means of idle periods in the triggering, in such a way that the conductive phases of the output transistors do not overlap. One such solution is described in a data report by the company Silicon General entitled "Linear Integrated Circuits", June 1985, SG3646. Another such solution is described in the reprinted article by Andrew Murray, entitled "Smart-power Treiber-ICs" [Smart Power Driver ICs], Design & Elektronik [Design & Electronics], No. 21, 1986. Both solutions use idle periods, which are constant and may optionally differ for switching transistors on and off, in triggering.

The production of these idle periods in the prior art methods may, for example, be based on the finite rise times of the input signal with the aid of two Schmitt triggers, having overlapping hystereses. The switch-over limits of one Schmitt trigger are within the switch-over limits of another Schmitt trigger. The output signals of the Schmitt triggers are linked together through logic gates and delivered to buffer amplifiers, which trigger the complementary output transistors.

Another possibility for generating idle periods is to differently delay the positive or negative edges of the push-pull signals of the circuit configuration, which are derived from the input signal, through suitable buffer amplifiers, so that the negative control edge always reaches the complementary output transistors for triggering prior to the positive edge. This solution is adopted in the report by Silicon General.

The disadvantage of the prior art structures is that the idle periods produced are independent of the storage period of the output transistors. If there is an increase in the storage period, that is the period within which the base-to-collector flow diode capacity is discharged and the base zone of the particular output transistor is evacuated or emptied, due to a change in the corresponding trigger current of the output transistor, load transistor, evacuation current, temperature or operating voltage stroke, or if the idle period produced becomes shorter as a result of other changes in parameters of the circuit configuration, then there is the danger that the storage periods of the output transistors will become longer than the idle periods, and transverse currents will flow. On the other hand, if the safety performance of the circuit is dimensioned in such a way that a collision of the idle period with the storage period cannot occur in any case, then the circuit becomes expensive and unnecessarily slow, or in other words unusable for high switching frequencies.

It is accordingly an object of the invention to provide a method for transverse-current-free operation of a push-pull circuit and an apparatus for performing the method, which overcomes the hereinafore-mentioned disadvantages of the heretofore-known methods and devices of this general type and in which the required idle period of two push-pull signals derived from one output signal can be optimally adapted to the parasitic line performance of the complementary output transistors, for triggering complementary output transistors.

With the foregoing and other objects in view there is provided, in accordance with the invention, a method for transverse-current-free operation of a push-pull circuit configuration having two output transistor arrays of complementary types with output circuits interconnected in series, and a trigger circuit triggering the output transistor arrays with two push-pull signals being derived from one input signal and having mutually associated edges consecutively following one another with temporal separation and detecting output currents of the output transistor arrays, which comprises releasing the particular triggering push-pull signal for an output transistor array without delay whenever the output current of the complementary output transistor arrays drops below a predetermined positive minimum value.

In accordance with another mode of the invention, there is provided a method which comprises detecting and comparing base-to-emitter voltages of the complementary output transistor arrays with respective positive reference voltages.

With the objects of the invention in view, there is also provided an apparatus for transverse-current-free operation of a push-pull circuit configuration, comprising two output transistor arrays of complementary types with output circuits interconnected in series, and a trigger circuit triggering the output transistor arrays with two push-pull signals being derived from one input signal and having mutually associated edges consecutively following one another with temporal separation, and detecting output currents of the output transistor arrays and for releasing the particular triggering push-pull signal for an output transistor array without delay whenever the output current of the complementary output transistor arrays drops below a predetermined positive minimum value, the trigger circuit including logical linkage elements each having first and second inputs, and comparators associated with the output transistor arrays for detecting the predetermined minimum output currents, the comparators each having an output cross-coupled directly to the first input of a respective one of the logical linkage elements, the second input of one of the logical linkage elements receiving the input signal and the second input of the other of the logical linkage elements receiving an inverted input signal.

In accordance with a further feature of the invention, each of the comparators have two inputs, one input of each of the comparators is connected to the base of a respective one of the output transistor arrays, and there are provided reference voltage sources each being connected between the other input of a respective one of the comparators and the emitter of a respective one of the output transistor arrays.

In accordance with a concomitant feature of the invention, the logical linkage elements are AND gates having outputs, and there are provided buffer amplifiers each being connected to the output of a respective one of the AND gates.

The method and the circuit configuration according to the invention have the advantage of ensuring that the push-pull signal for the output transistor to be switched into the conductive output state is not released until meeting a blocking criterion which is valid for the transistor to be blocked, after an examination of the relevant data of the transistor. Thus the push-pull signals for triggering the complementary output signals can be optimally adapted to the parasitic line properties of the output transistors.

Other features which are considered as characteristic for the invention are set forth in the appended claims.

Although the invention is illustrated and described herein as embodied in a method for transverse-current-free operation of a push-pull circuit and an apparatus for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1A:
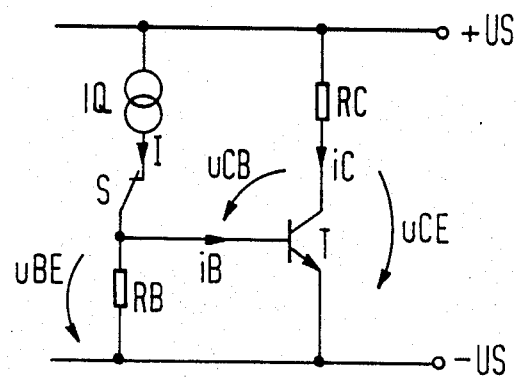
FIG. 1a is a fundamental schematic circuit diagram and FIG. 1b is a diagram explaining the primary physical effect upon the switching off of a transistor.

Referring now in detail to the figures of the drawing in which identical elements are provided with the same reference numerals and first, particularly, to FIG. 1a thereof, there is seen a substitute or equivalent circuit which is connected through connection terminals to poles $+US$ and $-US$ of a supply voltage source. When a switch S is closed, a current source IQ generates a current I, which divides and flows as a base current iB into a transistor T on one hand, and through a base resistor RB to the negative supply voltage terminal $-US$ on the other hand. The resistor RB generates a base-to-emitter voltage drop uBE for triggering the transistor T.

The collector of the transistor T is connected through a collector resistor RC to the positive supply voltage source $+US$ and the emitter of the transistor T is connected directly to the negative supply voltage source $-US$.

Figure 1B:
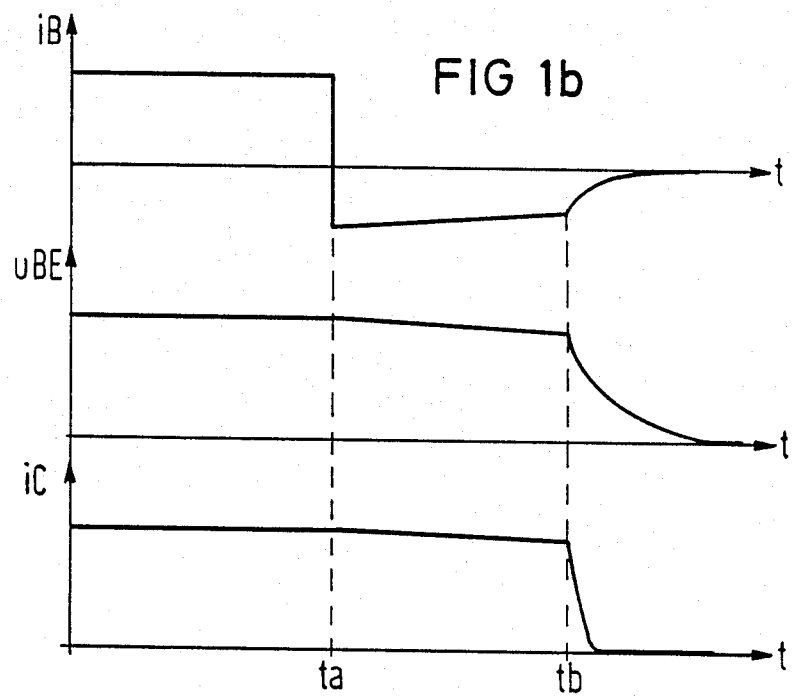

The diagram of FIG. 1b shows the switching off of the transistor T qualitatively, its base being evacuated or emptied through the resistor RB. When the switch S opens at a time ta, the base current iB immediately reverses, because the charge stored in the base drains out. The transistor T remains in saturation until a time tb, at which the collector-to-base voltage uCB becomes zero. From the time tb on, only the base-to-emitter flow capacity must be discharged. The drop of the base-to-emitter voltage uBE takes place in accordance with an exponential function. As soon as the collector current iC dependent on the base-to-emitter voltage uBE becomes sufficiently low, the transistor T can be considered to be off. The term "sufficiently low" means that the collector current must be so low that damage to the transistors of a push-pull circuit is precluded. The value of this variable is definable by one skilled in the art depending on the intended application and may, for instance, be 10% of the rated current of the transistor. As a rule, the time during which the transistor T remains in saturation is longer than the time during which the base-to-emitter voltage subsequently drops to a minimum value.

In a push-pull circuit, one of the two complementary output transistors is made conductive the other is blocked in alternation. At the output of the circuit, which is located at the connecting point of the output circuits of the two complementary transistors, the voltage of the supply source $+US$ or $-US$, which is reduced in amount by the saturation voltage of the particular transistor that is conductive, is then present in alternation.

As mentioned above, upon a simultaneous reversal of the two complementary transistors, one of the transistors becomes fully conductive before the other transistor fully blocks, because of the effect explained above. In such a case, both output transistors are conductive, and the currents flowing through them rise to a value that is limited only by the current gain of the output transistors. This current, which is known as a transverse-current, cross-current or quadrature-axis component of current or a cross-line current, which flows between the connection poles of the supply voltage source, produces very high power losses, or even damages the output transistors. The transverse current drops from the moment that the base of the transistor entering the blocking state is evacuated or emptied and the output voltage can assume the specified value.

Figure 2:
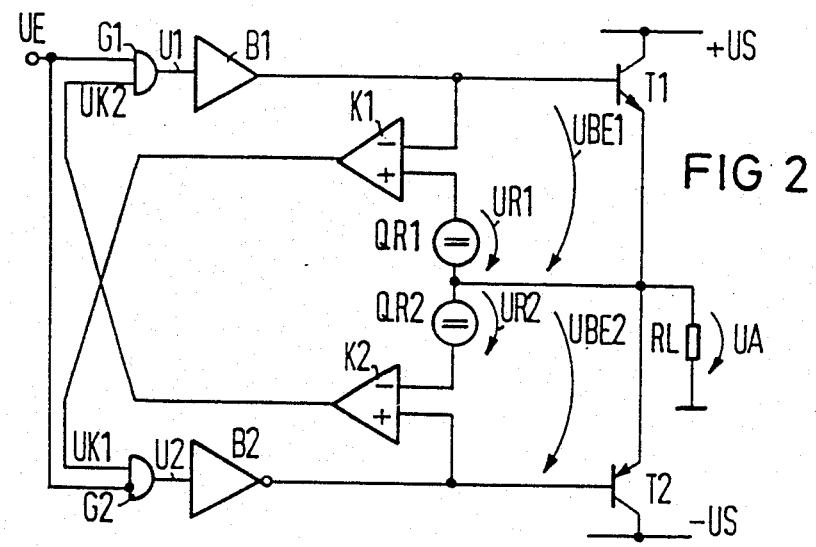
FIG. 2 is a schematic circuit diagram of the particular embodiment of the invention.

The invention will now be described in further detail in terms of an embodiment shown in FIG. 2 which is used purely as an example. However, the invention is also applicable to other embodiments to the same advantage. In FIG. 2, an input signal at a terminal UE is linked with the aid of a logic element G1 to an output signal UK2 of a comparator K2. The output signal of the logic element G1 is used, through a buffer amplifier B1, for triggering an n-p-n output transistor T1. On the other hand, the input signal present at the terminal UE is inverted and is linked with an output signal UK1 of a comparator K1 with the aid of a logic element G2. The output signal of the logic element G2 serves to trigger a p-n-p output transistor T2, with the intervention of an inverted buffer amplifier B2. The logic elements G1 and G2 are in the form of AND gates. The output circuits of the complementary output transistors T1 and T2 are connected in series and are located between the terminals +US and −US of the supply voltage source. The connecting point of the output circuits of the transistors T1 and T2 represents the output of the circuit, to which a load resistor RL, for instance, is connected. The inverting input of the comparator K1 is connected to the base of the transistor T1 and the non-inverting input thereof is connected through a first reference voltage source QR1 to the output of the circuit. The non-inverting input of the comparator K2 is connected to the base of the transistor T2 and the inverting input thereof is connected through a second reference voltage source QR2 to the output of the circuit.

Instead of two complementary output transistors, it is also possible to use complementarily performing output transistor arrays, the (power) output transistors of which are of the same type, for instance the n-p-n type, and the driver transistors of which that trigger the (power) output transistors, are of the complementary type. The complementary output transistor array then corresponds in its performance to complementary output transistors.

According to the invention, the linkage of the push-pull signals for triggering the complementary output transistors to the parasitic line properties of these output transistors is effected in accordance with the invention in such a way that the output currents of the output transistors are detected and the particular triggering push-pull signal is not released until the output current of the complementary output transistor drops below a predetermined minimum value. In the embodiment used as an example in FIG. 2, the criterion for the blocking state of an output transistor is its base-to-emitter voltage which, as explained in conjunction with FIG. 1, is related to the output current of the output transistor.

In accordance with the embodiment used as an example in FIG. 2, the comparators K1 and K2 compare the base-to-emitter voltages UBE1 and UBE2 of the output transistors T1 and T2 to the reference voltages UR1 and UR2 produced by the associated reference voltage sources QR1 and QR2. The reference voltages UR1 and UR2 are selected in such a way that upon a comparison with the base-to-emitter voltage of the associated transistor, they are equivalent to an output current which is sufficiently low to meet the blocking criterion of the transistor. Thus an adaptation of the switching time of the entire circuit configuration to the parasitic line properties of the output transistors is automatically accomplished.

For instance, if in the embodiment used as an example in FIG. 2 a criterion calling for UBE1 to be less than UR1 is met, in other words if the output transistor T1 is off, then the comparator K1 releases the lower output transistor T2, through the logic element G2. Similarly, UBE2 must first have dropped below the reference voltage UR2, before the output transistor T1 can be switched on through the logic element G1. Any change in the parasitic line properties of the output transistors is detected in this way and can in no case lead to transverse currents.

Figure 3:
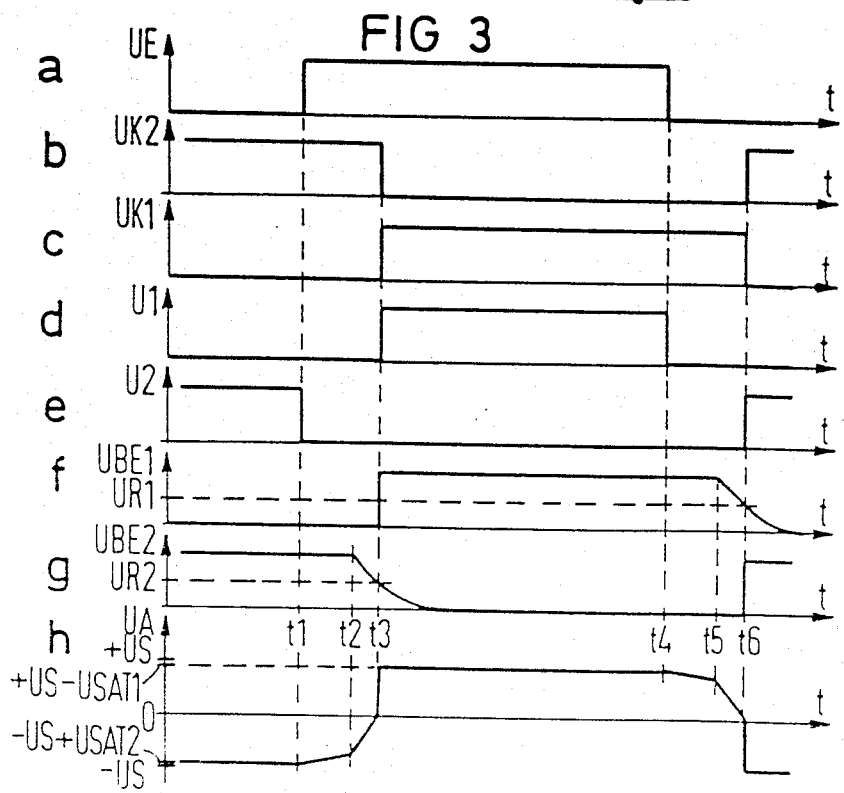
FIG. 3 is a diagram explaining the functioning of the circuit according to FIG. 2.

The diagram of FIG. 3 explains the function of the circuit configuration of FIG. 2 in terms of signals. When there is a positive signal edge of the input signal UE at a time t1, as shown in the portion a of FIG. 3, the triggering of the transistor T2 through the logic element G2 and the output voltage U2 thereof is switched off immediately, as shown in the portion e. In the portions g and h, the stored charge in the transistor T2 is then evacuated until time a t2, at which the collector-to-base voltage of the transistor T2 is zero. Next, the base-to-emitter flow capacity of the transistor is discharged. As soon as the base-to-emitter voltage UBE2 of the transistor T2 drops quantitatively below the reference voltage UR2, at a time t3, the comparator K2 switches and according to the portion b emits the voltage UK2, so that the push-pull signal for triggering the transistor T1 is released through the logic element G1 and the output voltage U1 thereof. As shown in the portion h, prior to the time t1 and after time t3, the output voltage UA through the load resistor RL is at a value which is quantitatively equivalent to the prevailing supply voltage, minus the saturation voltage of the particular transistor then conductive, or in other words it is between −US−+USAT2 and +US−USAT1 in the embodiment used as an example. If there is a change in the negative edge of the input signal, then the process shown in FIG. 3 and times t4–t6 occur in reverse order.

What is claimed:

1. In a method for transverse-current-free operation of a push-pull circuit configuration having two output transistor arrays of complementary types with output circuits interconnected in series, and a trigger circuit triggering the output transistor arrays with two push-pull signals being derived from one input signal and having mutually associated edges consecutively following one another with temporal separation for detecting output currents of the output transistor arrays, the improvement which comprises releasing the particular triggering push-pull signal for an output transistor array without delay whenever the output current of the complementary output transistor arrays drops below a predetermined positive minimum value, detecting base-to-emitter voltages of the complementary output transistor arrays for determining their output currents, and comparing said base-to-emitter voltages, using respective positive reference voltages as minimum values.

2. Apparatus for transverse-current-free operation of a push-pull circuit configuration in combination with the push-pull circuit configuration, comprising two output transistor arrays of complementary types with output circuits interconnected in series, and a trigger circuit triggering said output transistor arrays with two push-pull signals being derived from one input signal and having mutually associated edges consecutively following one another with temporal separation, and detecting output currents of the output transistor arrays for releasing the particular triggering push-pull signal for an output transistor array without delay whenever the output current of the complementary output transistor arrays drop below a predetermined positive minimum value, said trigger circuit including logical linkage elements each having first and second inputs, and comparators associated with said output transistor arrays for detecting the predetermined minimum output currents, said comparators each having an output cross-coupled directly to the first input of a respective one of said logical linkage element, the second input of one of said logical linkage elements receiving the input signal and the second input of the other of said logical linkage elements receiving an inverted input signal; wherein each of said comparators has two inputs, one input of each of said comparators is connected to the base of a respective one of said output transistor arrays, and including reference voltage sources each being connected between the other input of a respective one of said comparators and the emitter of a respective one of said output transistor arrays.

3. Apparatus according to claim 2, wherein said logical linkage elements are AND gates having outputs, and including buffer amplifiers each being connected to the output of a respective one of said AND gates.

4. Apparatus for transverse-current-free operation of a push-pull circuit configuration in combination with the push-pull circuit configuration, comprising two output transistor arrays of complementary types with output circuits interconnected in series, and a trigger circuit triggering said output transistor arrays including logical linkage elements each having first and second inputs, and comparators associated with said output transistor arrays, said comparators each having an output cross-coupled directly to the first input of a respective one of said logical linkage elements, the second input of one of said logical linkage elements receiving the input signal and the second input of the other of said logical linkage elements receiving an inverted input signal; wherein each of said comparators has two inputs, one input of each of said comparators is connected to the base of a respective one of said output transistor arrays, and including reference voltage sources each being connected between the other input of a respective one of said comparators and the emitter of a respective one of said output transistor arrays.

* * * * *